United States Patent
Shen et al.

(10) Patent No.: US 10,522,751 B2
(45) Date of Patent: Dec. 31, 2019

(54) MTJ CD VARIATION BY HM TRIMMING

(71) Applicant: Taiwan Semiconductor Manufacturing Company, Ltd., Hsinchu (TW)

(72) Inventors: Dongna Shen, San Jose, CA (US); Yi Yang, Fremont, CA (US); Jesmin Haq, Milpitas, CA (US); Yu-Jen Wang, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 15/986,183

(22) Filed: May 22, 2018

(65) Prior Publication Data

US 2019/0363248 A1    Nov. 28, 2019

(51) Int. Cl.
| | |
|---|---|
| *H01L 43/12* | (2006.01) |
| *H01F 41/34* | (2006.01) |
| *H01F 10/32* | (2006.01) |
| *G11C 11/16* | (2006.01) |
| *H01L 43/08* | (2006.01) |
| *H01L 43/02* | (2006.01) |

(52) U.S. Cl.
CPC ............ *H01L 43/12* (2013.01); *G11C 11/161* (2013.01); *H01F 10/3254* (2013.01); *H01F 41/34* (2013.01); *H01L 43/08* (2013.01); *H01L 43/02* (2013.01)

(58) Field of Classification Search
CPC ......... H01L 43/12; H01L 43/08; H01L 43/02; G11C 11/161; H01F 41/34; H01F 10/3254
See application file for complete search history.

(56) References Cited

U.S. PATENT DOCUMENTS

| | | | |
|---|---|---|---|
| 7,550,044 B2 | 6/2009 | Gaidis et al. | |
| 7,910,483 B2 | 3/2011 | Abatchev et al. | |
| 8,975,089 B1* | 3/2015 | Jung | H01L 43/12 257/295 |
| 9,779,952 B2 | 10/2017 | Ranjan et al. | |
| 2006/0221515 A1* | 10/2006 | Carey | B82Y 25/00 360/324.12 |
| 2013/0029431 A1* | 1/2013 | Takahashi | H01L 43/12 438/3 |
| 2014/0198564 A1* | 7/2014 | Guo | G11C 11/161 365/158 |
| 2015/0104882 A1* | 4/2015 | Jung | H01L 43/12 438/3 |
| 2016/0268338 A1 | 9/2016 | Kashiwada et al. | |

\* cited by examiner

*Primary Examiner* — Edward Chin
(74) *Attorney, Agent, or Firm* — Haynes and Boone, LLP

(57) ABSTRACT

A MTJ stack is deposited on a bottom electrode. A metal hard mask is deposited on the MTJ stack and a dielectric mask is deposited on the metal hard mask. A photoresist pattern is formed on the dielectric mask, having a critical dimension of more than about 65 nm. The dielectric and metal hard masks are etched wherein the photoresist pattern is removed. The dielectric and metal hard masks are trimmed to reduce their critical dimension to 10-60 nm and to reduce sidewall surface roughness. The dielectric and metal hard masks and the MTJ stack are etched wherein the dielectric mask is removed and a MTJ device is formed having a small critical dimension of 10-60 nm, and having further reduced sidewall surface roughness.

20 Claims, 2 Drawing Sheets

MTJ CD VARIATION BY HM TRIMMING

TECHNICAL FIELD

This application relates to the general field of magnetic tunneling junctions (MTJ) and, more particularly, to etching methods for forming sub 60 nm MTJ structures.

BACKGROUND

Fabrication of magnetoresistive random-access memory (MRAM) devices normally involves a sequence of processing steps during which many layers of metals and dielectrics are deposited and then patterned to form a magnetoresistive stack as well as electrodes for electrical connections. To define the magnetic tunnel junctions (MTJ) in each MRAM device, precise patterning steps including photolithography and reactive ion etching (RIE), ion beam etching (IBE), or their combination are usually involved. MTJ critical dimension (CD) variation is a critical parameter because large CD variation can cause significant variations in MTJ resistance and switching current. Besides pattern density, the CD variation is mainly dependent on photo CD variation, which is limited mainly by wavelength of the exposure light, dose, focus, lens aberration, and mask error. The MTJ area may vary as much as 10% due to photoresist sidewall roughness. However, larger photo CD will always have less variation than smaller photo CD due to less wavelength effect and/or less edge effect. Sidewall roughness leads to large CD variation for small CD. For example, if the sidewall roughness is 1.5 nm, it will be 3 nm on both sides. This will cause a 2% CD variation for a 150 nm device, but a 4% CD variation for a 75 nm device.

Using short wavelength light for exposure is the most effective way to make small CD with better CD uniformity. The dominant lithography technology uses 248 nm or 193 nm wavelength; however, the current state-of-the-art photolithography is 13.5 nm EUV. It desired to find a way to minimize photoresist roughness and CD variation.

Several patents teach methods of hard mask trimming, including U.S. Pat. No. 9,779,952 (Ranjan et al), U.S. Pat. No. 7,910,483 (Abatchev et al), and U.S. Pat. No. 7,550,044 (Gaidis et al) and U.S. Patent Application 2016/0268338 (Kashiwada et al). These references are different from the present disclosure.

SUMMARY

It is an object of the present disclosure to provide an improved method of forming MTJ structures having a critical dimension of 10-60 nm.

Another object of the present disclosure is to provide an improved method of forming MTJ structures having a critical dimension of 10-60 nm by adding a hard mask trimming step prior to MTJ etching to improve the quality of the hard mask.

Yet another object is to provide an improved method of forming MTJ structures having a critical dimension of 10-60 nm by using a photoresist mask having a critical dimension of 40-115 nm and by adding a hard mask trimming step prior to MTJ etching to improve the quality of the hard mask.

In accordance with the objectives of the present disclosure, a method for etching a magnetic tunneling junction (MTJ) structure is achieved. A MTJ stack is deposited on a bottom electrode. A conductive hard mask is deposited on the MTJ stack and a dielectric mask is deposited on the conductive hard mask. A photoresist pattern is formed on the dielectric mask, having a critical dimension of about 65-115 nm. The dielectric and conductive hard masks are etched wherein the photoresist pattern is removed. The dielectric and conductive hard masks are trimmed to reduce their critical dimension to 10-60 nm and to reduce sidewall surface roughness. The dielectric and conductive hard masks and the MTJ stack are etched wherein the dielectric mask is removed and a MTJ device is formed having a small critical dimension of 10-60 nm, and having further reduced sidewall surface roughness.

BRIEF DESCRIPTION OF THE DRAWINGS

In the accompanying drawings forming a material part of this description, there is shown.

DETAILED DESCRIPTION

Figure 1:
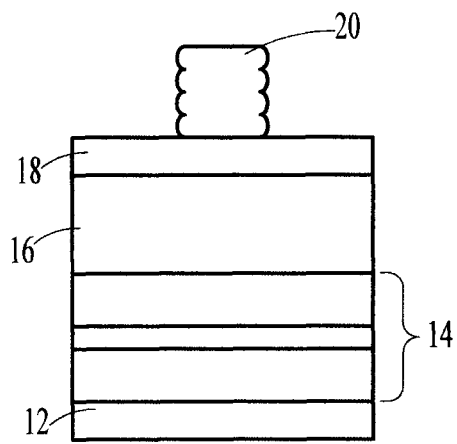
FIGS. 1 through 4 illustrate in cross-sectional representation steps in prior art process.

FIGS. 1-4 illustrate a conventional MTJ fabrication process. FIG. 1 illustrates a MTJ stack 14 on a bottom electrode 12. A metal hard mask 16 and a dielectric anti-reflective coating (DARC) or bottom anti-reflective coating (BARC) layer 18 are deposited over the MTJ stack. A small critical dimension (CD) photoresist 20 has been patterned. A small CD is about 40-85 nm. It can be seen that the photoresist layer 20 has some roughness on the sidewalls. This roughness is due to a variety of factors, such as the roughness from the photolithography mask, the exposure noise, the interaction between resist, substrate and topcoat, random molecular diffusion, distribution and reaction, nonzero size of polymer during development, and so on.

Figure 2:
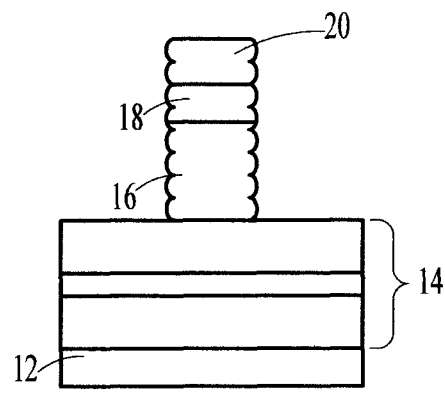
Figure 3:
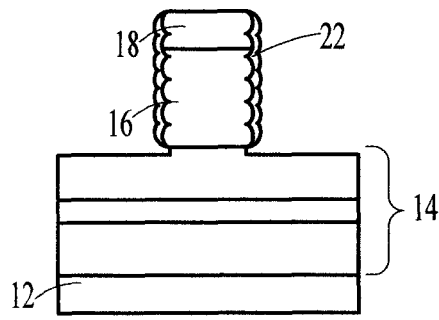

Now, the DARC and hard mask layers 16 and 14 are etched where they are not covered by the photoresist mask 20, as shown in FIG. 2. Some of the photoresist mask is consumed by this etching and the sidewall surface roughness is transferred to the hard mask sidewalls. Now, the photoresist mask 20 is stripped using a standard photoresist stripping method. The photoresist is removed, but re-deposition of some of the removed photoresist and other materials on the hard mask sidewalls 22 increases the sidewall roughness, as illustrated in FIG. 3.

Figure 4:
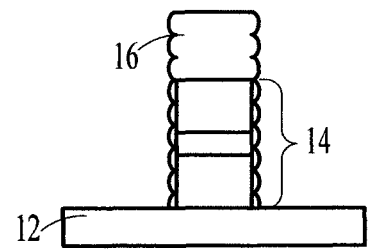

Now, the MTJ stack 14 is etched using the hard mask as a pattern. All of the DARC layer 18 and some of the hard mask layer 16 are consumed by this etching step. The sidewall surface roughness is transferred to the MTJ sidewalls, as shown in FIG. 4. The sidewall roughness will increase the MTJ CD area variation. Large area variation can cause significant variations in MTJ resistance and switching current.

The present disclosure provides a process for lowering CD variation. The existing process needs a small photo CD (about 50 nm) with a photo mask size of about 186 nm to achieve a small etch CD (approximately 10-60 nm). The CD variation is large. The process of the present disclosure is able to use a larger photo CD (75 nm vs 50 nm) with the same photo mask size (186 nm) to reduce CD variation. Furthermore, a hard mask (HM) trimming step is added after the hard mask etch. This process can achieve the same or smaller (10-60 nm) etch CD with less CD variation. Even smaller CD can be achieved by increasing the HM trimming amount.

Figure 5:
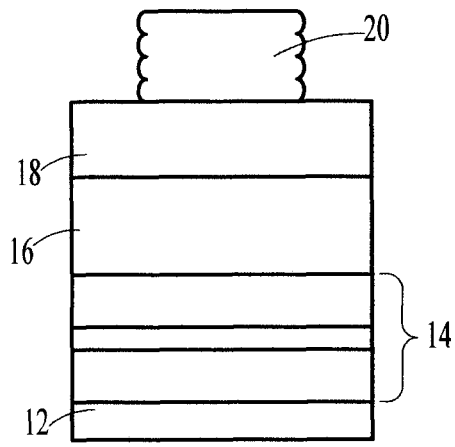
FIGS. 5 through 9 illustrate in cross-sectional representation steps in a preferred embodiment of the present disclosure.

The preferred embodiment of the present disclosure will be described in more detail with reference to FIGS. 5-9. FIG. 5 illustrates a bottom electrode layer 12 formed on a semiconductor substrate, not shown.

MTJ film layers are deposited, typically including a seed layer, a pinned layer, a barrier layer, a free layer, and a cap layer, for example. These layers form the MTJ film stack 14. Now, a conductive hard mask layer 16 is deposited on the MTJ stack. The hard mask 16 may be Ta, TaN, Ti, TiN, W, Ru, Mo, Al, or their alloys having a thickness of between about 30 and 100 nm.

Next, a BARC or DARC layer 18, such as $SiO_2$, SiN, SiON, SiC, SiCN, carbon, or Advanced Pattering Film (APF®) is deposited over the hard mask layer 16 to a thickness of between about 10 and 150 nm. Finally, photoresist 20 is patterned to a CD width of 40-115 nm, and preferably greater than about 65 nm. This larger CD will lower CD variation. The photoresist mask 20 still has sidewall roughness, however.

Figure 6:
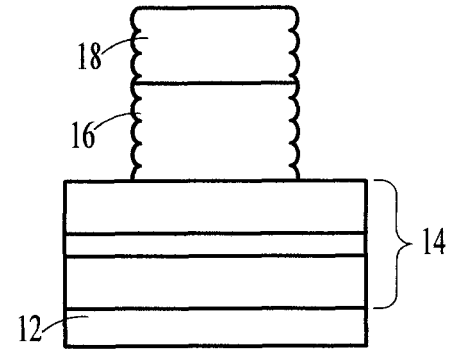

Now, referring to FIG. 6, the DARC/BARC and hard mask layers are etched using either reactive ion etching (RIE) using fluorine or chlorine based chemicals or ion beam etching (IBE). All of the photoresist mask and some of the DARC layer 18 are consumed by this etching process. The sidewall roughness of the photoresist mask is transferred to the hard mask sidewalls as shown in FIG. 6.

Figure 7:
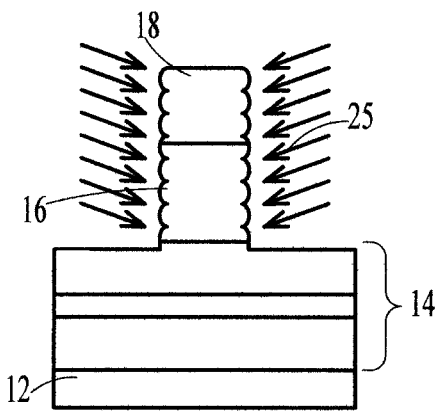

Next, referring to FIG. 7, the key hard mask trimming step is applied. A high angle IBE etching 25 using Ar, Kr, Ne, or Xe is applied to the DARC/hard mask 18/16 using an angle of between about 55 and 85 degrees with respect to the normal direction of the top surface of the MTJ stack. Alternatively, a low or zero bias power RIE using fluorine or chlorine based chemicals may be applied. The bias power should be between about 0 and 50 W. This trimming step reduces the CD of the hard mask stack to between about 10 and 60 nm and significantly reduces the sidewall roughness of the hard mask stack.

Figure 8:
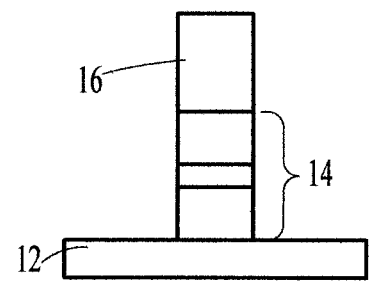

Referring now to FIG. 8, the MTJ stack 14 is etched by pure Methanol RIE, Methanol/Ar RIE, Methanol/Ar/$O_2$ RIE, alternating RIE and IBE, pure IBE using Ar, Kr, Ne, or Xe inert gas, or inert gas combined with $O_2$, $CH_3OH$, or $C_2H_5OH$, or alternating IBE with methanol or ethanol treatment. For IBE etching, this can be at a high angle, low angle, then high angle after hard mask etching. Pre-sputter, a low power inert gas plasma process used to remove MTJ device sidewall redeposited materials or damage before encapsulation, may be applied. The MTJ stack etching process also removes all of the DARC layer 18 and some of the conductive hard mask layer 16. The MTJ sidewall roughness is further reduced. Since the protruding portion on the sidewall has a higher etch rate, it will be removed faster because the IBE etch rate is incident angle dependent and a small CD of 10 to 60 nm is achieved.

Figure 9:
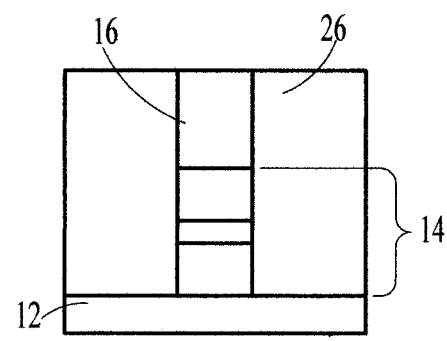

After patterning, the whole device can be encapsulated by dielectric or metal oxide such as $SiO_2$, SiN, SiON, SiC, SiCN, $Al_2O_3$ and MgO 26, as shown in FIG. 9. Either ex-situ or in-situ encapsulation may be used. A final CMP step is applied to flatten the surface and expose the hard mask layer 16. The remaining hard mask 16 acts as a top electrode.

The process of the present disclosure was implemented and tested. Six samples were prepared. The first two samples started with the larger photo CD (80-90 nm) and the hard mask trimming step of the present disclosure. The last four samples started with the smaller photo CD (40-50 nm) of the conventional process and without hard mask trimming. For every sample, one Transmission Electron Microscopy (TEM) cut was done on approximately 10 adjacent devices and all CD's were measured on the TEM images, as shown in Table 1. The first two samples with larger photo CD and with hard mask trimming showed smaller variation than the other four samples with smaller photo CD and without hard mask trimming. The table shows a standard deviation of the first two samples fabricated according to the process of the present disclosure of at most 1.7 nm, or 4.5% while the samples fabricated according to a conventional process had a standard deviation of 2.8-8.7 nm, or 9.3-34%.

TABLE 1

TEM Measured CDs (nm) of multiple devices within one TEM cut

| Device | Sample 1 | Sample 2 | Sample 3 | Sample 4 | Sample 5 | Sample 6 |
|---|---|---|---|---|---|---|
| 1 | 37.52 | 39.61 | 30.40 | 22.98 | 30.08 | 15.00 |
| 2 | 37.52 | 39.03 | 25.95 | 48.03 | 34.42 | 25.33 |
| 3 | 37.52 | 37.60 | 30.08 | 37.86 | 28.60 | 5.00 |
| 4 | 34.19 | 39.03 | 29.28 | 44.11 | 27.75 | 19.77 |
| 5 | 37.52 | 37.49 | 28.94 | 39.66 | 27.75 | 34.03 |
| 6 | 33.18 | 39.40 | 36.33 | 21.02 | 34.42 | 20.03 |
| 7 | 35.19 | 38.55 | 34.10 | 36.17 | 32.73 | 25.39 |
| 8 | 37.52 | 37.28 | 34.10 | 44.64 | 29.23 | 25.12 |
| 9 | 37.63 | 35.53 | 30.40 | 28.49 | NA | 25.44 |
| 10 | 35.72 | 41.99 | 29.02 | 38.50 | NA | 30.00 |
| 11 | NA | NA | 30.77 | 38.60 | NA | 26.92 |
| Avg (nm) | 36.35 | 38.55 | 30.85 | 36.37 | 30.62 | 22.91 |
| SD (nm) | 1.66 | 1.73 | 2.93 | 8.74 | 2.83 | 7.84 |
| SD (%) | 4.58 | 4.48 | 9.48 | 24.03 | 9.25 | 34.22 |
| HM Trim | YES | YES | NO | NO | NO | NO |

The larger photo CD and hard mask trimming of the present disclosure can achieve the same size MTJ CD and lower resistance coefficient of variation (RpCov) for small devices (10-60 nm). RpCov was improved for small MTJ devices (10-60 nm) by making a larger photo CD with the same photo equipment and same photo mask size as is conventional in the art and an additional hard mask trimming step. The process of the present disclosure can reduce CD and sidewall roughness.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for etching a magnetic tunneling junction (MTJ) structure comprising:
    depositing a MTJ stack on a bottom electrode;
    depositing a conductive hard mask on said MTJ stack;
    depositing a dielectric mask on said conductive hard mask;
    forming a photoresist pattern on said dielectric mask, having a critical dimension of about 40-115 nm;
    first etching said dielectric and conductive hard masks wherein said photoresist pattern is removed;
    thereafter trimming said dielectric and conductive hard masks to reduce their critical dimension to 10-60 nm and to reduce sidewall surface roughness; and
    thereafter second etching said dielectric and conductive hard masks and said MTJ stack wherein said dielectric mask is removed and a MTJ device is formed having a small critical dimension of 10-60 nm, and having further reduced sidewall surface roughness.

2. The method according to claim 1 wherein said conductive hard mask comprises Ta, Ti, TaN, TiN, W, Ru, Mo, Al, or their alloys having a thickness of between about 30 and 100 nm.

3. The method according to claim 1 wherein said dielectric mask comprises $SiO_2$, SiN, SiON, SiC, SiCN, carbon, or APF having a thickness of between about 10 and 150 nm.

4. The method according to claim 1 wherein said first etching comprises reactive ion etching (RIE) using fluorine or chlorine based chemicals or ion beam etching (IBE).

5. The method according to claim 1 wherein said trimming comprises an IBE etching using Ar, Kr, Ne, Xe, or their combination at an angle of between about 55 and 85 degrees with respect to a normal direction of a top surface of said MTJ stack or a RIE etching using fluorine or chlorine based chemicals with bias power of between about 0 and 50 W.

6. The method according to claim 1 wherein said second etching comprises pure Methanol RIE, Methanol/Ar RIE, Methanol/Ar/$O_2$ RIE, alternating RIE and IBE, pure IBE using Ar, Kr, Ne, or Xe inert gas, or inert gas combined with $O_2$, $CH_3OH$, or $C_2H_5OH$, or alternating IBE with methanol or ethanol treatment.

7. A method for etching a magnetic tunneling junction (MTJ) structure comprising:
   depositing a MTJ stack on a bottom electrode;
   depositing a conductive hard mask on said MTJ stack;
   depositing a dielectric mask on said conductive hard mask;
   forming a photoresist pattern on said dielectric mask, having a critical dimension of about 40-115 nm, wherein said photoresist pattern has sidewall surface roughness;
   first etching said dielectric and conductive hard masks wherein said photoresist pattern is removed and wherein said dielectric and conductive hard masks have sidewall surface roughness;
   thereafter trimming said dielectric and conductive hard masks to reduce their critical dimension to 10-60 nm and to reduce said sidewall surface roughness; and
   thereafter second etching said dielectric and conductive hard masks and said MTJ stack wherein said dielectric mask is removed and a MTJ device is formed having a small critical dimension of 10-60 nm, and having further reduced said sidewall surface roughness.

8. The method according to claim 7 wherein said conductive hard mask comprises Ta, Ti, TaN, TiN, W, Ru, Mo, Al, or their alloys having a thickness of between about 30 and 100 nm.

9. The method according to claim 7 wherein said dielectric mask comprises $SiO_2$, SiN, SiON, SiC, SiCN, carbon, or APF having a thickness of between about 10 and 150 nm.

10. The method according to claim 7 wherein said first etching comprises reactive ion etching (RIE) using fluorine or chlorine based chemicals or ion beam etching (IBE).

11. The method according to claim 7 wherein said trimming comprises an IBE etching using Ar, Kr, Ne, or Xe at an angle of between about 55 and 85 degrees with respect to a top surface of said MTJ stack or a RIE etching using fluorine or chlorine based chemicals with bias power of between about 0 and 50 W.

12. The method according to claim 7 wherein said second etching comprises pure Methanol RIE, Methanol/Ar RIE, Methanol/Ar/$O_2$ RIE, alternating RIE and IBE, pure IBE using Ar, Kr, Ne, or Xe inert gas, or inert gas combined with $O_2$, $CH_3OH$, or $C_2H_5OH$, or alternating IBE with methanol or ethanol treatment.

13. A method comprising:
   forming a magnetic tunneling junction (MTJ) stack on a first electrode;
   forming a conductive hard mask on the MTJ stack;
   forming a dielectric mask directly on the conductive hard mask such that the dielectric mask physically contacts the conductive hard mask;
   patterning the dielectric mask and the conductive hard mask, wherein a roughness of a sidewall surface of the conductive hard mask is increased after the patterning of the dielectric mask and the conductive hard mask;
   trimming the patterned dielectric mask and the patterned conductive hard mask to reduce the roughness of the sidewall surface of the conductive hard mask; and
   patterning the trimmed patterned dielectric mask, the trimmed patterned conductive hard mask and the MTJ stack, wherein the patterning of the trimmed patterned dielectric mask includes completely removing the trimmed patterned dielectric mask, wherein the patterning of the trimmed patterned conductive hard mask further reduces the roughness of the sidewall surface of the conductive hard mask.

14. The method of claim 13, further comprising encapsulating the MTJ stack.

15. The method of claim 13, wherein the trimmed patterned dielectric mask, the trimmed patterned conductive hard mask and the patterned MTJ stack each have a critical dimension of about 10 nm to about 60.

16. The method of claim 13, wherein the patterning of the dielectric mask and the conductive hard mask includes performing a reactive ion etching process using a chemical selected from the group consisting of fluorine and chlorine.

17. The method of claim 13, wherein the patterning of the dielectric mask and the conductive hard mask includes performing ion beam etching.

18. The method of claim 13, wherein the trimming of the patterned dielectric mask and the patterned conductive hard mask includes performing a reactive ion etching process etching using a chemical selected from the group consisting of fluorine and chlorine, and
   wherein the reactive ion etching process is performed with bias power of between about 0 W and about 50 W.

19. The method of claim 13, wherein the patterning of the trimmed patterned dielectric mask, the trimmed patterned conductive hard mask and the MTJ stack includes performing a reactive ion etching process and an ion beam etching process.

20. The method of claim 13, wherein the conductive hard mask includes a material selected from the group consisting of Ti, TaN, TiN, W, Ru, and Mo, and
   wherein the dielectric mask includes a material selected from the group consisting of $SiO_2$, SiON, SiC, SiCN, carbon, and APF.

* * * * *